(12) United States Patent
Labin et al.

(10) Patent No.: US 7,405,983 B1
(45) Date of Patent: Jul. 29, 2008

(54) DIAGONAL MATRIX DELAY

(75) Inventors: Tomer Labin, Haifa (IL); David Moshe, D.N. Gilboa (IL); Shmuel Dino, Asadod (IL); Amir Gabai, Modii'n (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 379 days.

(21) Appl. No.: 11/330,982

(22) Filed: Jan. 12, 2006

Related U.S. Application Data (62) Division of application No. 10/873,591, filed on Jun. 23, 2004, now Pat. No. 7,050,341.

(60) Provisional application No. 60/494,223, filed on Aug. 11, 2003.

(51) Int. Cl.
*G11C 7/00* (2006.01)
(52) U.S. Cl. .................. 365/194; 365/189.05
(58) Field of Classification Search .................. 365/194, 365/189.05; 327/277
See application file for complete search history.

(56) References Cited

U.S. PATENT DOCUMENTS

| | | | |
|---|---|---|---|
| 5,095,233 A | | 3/1992 | Ashby et al. |
| 5,128,554 A | * | 7/1992 | Hoshizaki ............ 327/147 |
| 5,208,776 A | * | 5/1993 | Nasu et al. ............ 365/200 |
| 5,731,726 A | * | 3/1998 | Farwell et al. ............ 327/277 |
| 6,222,407 B1 | | 4/2001 | Gregor |
| 6,366,150 B1 | | 4/2002 | Ishimi |
| 6,388,482 B1 | | 5/2002 | Schnell et al. |
| 6,504,408 B1 | | 1/2003 | Von Kaenel |
| 6,538,517 B2 | | 3/2003 | Lu |
| 6,539,072 B1 | | 3/2003 | Donnelly et al. |
| 6,587,534 B2 | | 7/2003 | Hassoun et al. |
| 6,603,300 B2 | | 8/2003 | Lin et al. |
| 6,611,475 B2 | | 8/2003 | Lin et al. |
| 6,771,103 B2 | * | 8/2004 | Watanabe et al. ............ 327/161 |
| 2001/0015666 A1 | | 8/2001 | Noda et al. |
| 2003/0122599 A1 | | 7/2003 | Kim |

* cited by examiner

*Primary Examiner*—Anh Phung (57) ABSTRACT

A method of delaying an input signal comprises serially receiving the input signal at a plurality of rows of delay elements; applying a row selection signal to a row of delay elements to select the row from the plurality of rows; supplying a column selection signal to a tap buffer associated with a delay element in the selected row to select an output of the delay element; coupling outputs of tap buffers associated with delay elements in each row to form an output of each row; coupling outputs of each of the plurality of rows to provide an incrementally-delayed input signal from the selected row; outputting the incrementally-delayed input signal from the selected delay element in the selected row; and changing row selection from the selected row to a contiguous row of the plurality of rows in the absence of a change in the selection of the corresponding tap buffers.

10 Claims, 4 Drawing Sheets

FIG. 1
(Relevant Art)

TAP ORDER FOR DIAGONALLY-ARRANGED BUFFERS OF ROW 0 TO ROW 7 OF FIG. 2

|       |       |       |       |       |       |       |       |       |
|-------|-------|-------|-------|-------|-------|-------|-------|-------|
| ROW 0 | COL. 0 | COL. 1 | COL. 2 | COL. 3 | COL. 4 | COL. 5 | COL. 6 | COL. 7 |
| ROW 1 | COL. 7 | COL. 0 | COL. 1 | COL. 2 | COL. 3 | COL. 4 | COL. 5 | COL. 6 |
| ROW 2 | COL. 6 | COL. 7 | COL. 0 | COL. 1 | COL. 2 | COL. 3 | COL. 4 | COL. 5 |
| ROW 3 | COL. 5 | COL. 6 | COL. 7 | COL. 0 | COL. 1 | COL. 2 | COL. 3 | COL. 4 |
| ROW 4 | COL. 4 | COL. 5 | COL. 6 | COL. 7 | COL. 0 | COL. 1 | COL. 2 | COL. 3 |
| ROW 5 | COL. 3 | COL. 4 | COL. 5 | COL. 6 | COL. 7 | COL. 0 | COL. 1 | COL. 2 |
| ROW 6 | COL. 2 | COL. 3 | COL. 4 | COL. 5 | COL. 6 | COL. 7 | COL. 0 | COL. 1 |
| ROW 7 | COL. 1 | COL. 2 | COL. 3 | COL. 4 | COL. 5 | COL. 6 | COL. 7 | COL. 0 |

DIAGONAL MATRIX DELAY

CROSS-REFERENCE TO RELATED APPLICATIONS

The present application is a divisional of application Ser. No. 10/873,591 filed on Jun. 23, 2004 now U.S. Pat. No. 7,050,341, issued on May 23, 2006, which claims priority from U.S. Provisional Application Ser. No. 60/494,223, filed on Aug. 11, 2003, which are both hereby incorporated by reference in their entirety.

FIELD OF THE INVENTION

The present invention relates to integrated circuits. More particularly, the present invention relates to a diagonal matrix delay for delaying an input signal.

BACKGROUND OF THE INVENTION

Figure 1:
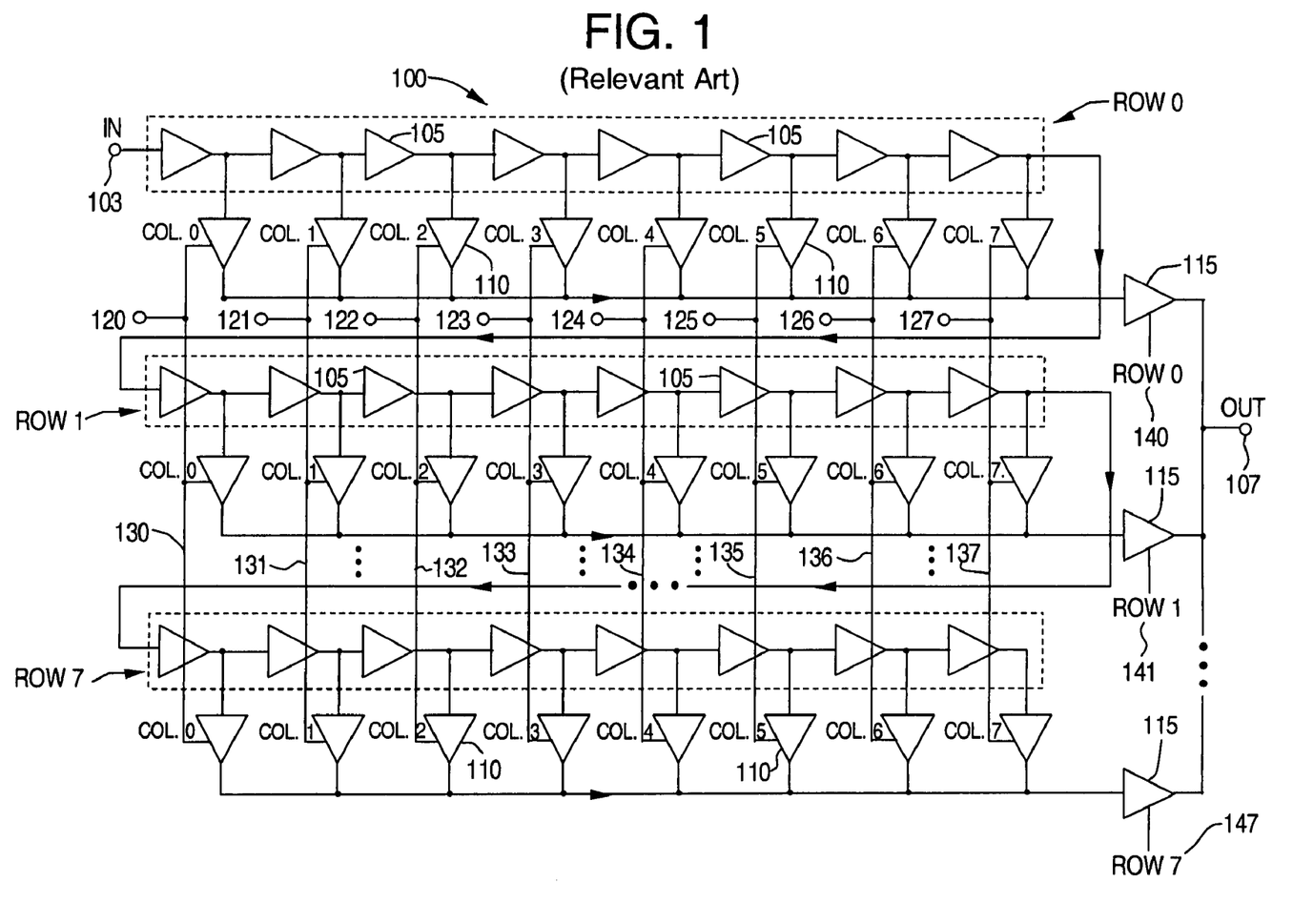
FIG. 1 is a circuit diagram illustrating a conventional matrix delay for delaying an input signal and providing an output signal.

FIG. 1 is a circuit diagram illustrating a conventional matrix delay 100 for delaying an input signal 103 and providing an output signal 107. For purposes of illustration, the delay matrix 100 can be comprised of eight rows (i.e., Row 0, Row 1, ..., Row 7), with each row comprised of eight delay elements 105. The rows are arranged in serial communication with each other, with the delay elements 105 within each row serially coupled to provide incremental delays for the input signal 103. The output of each delay element 105 in each row is in communication with a buffer 110, such as a tri-state buffer. The buffers 110 associated with each row are arranged in (vertical) columns. For purposes of illustration, the buffers 110 associated with each row are arranged in eight columns (i.e., Column 0, Column 1, ..., Column 7) to receive the output of each delay element 105.

The buffers 110 associated with each column are configured to receive a control signal for selecting a vertical column of buffers 110. For example, control line 130 is coupled to each of the buffers 110 vertically associated with Column 0 to receive control signal 120, control line 131 is coupled to each of the buffers 110 vertically associated with Column 1 to receive control signal 121, and so forth. The outputs of the buffers 110 associated with each row are coupled together to form an output for the row that is applied to a corresponding row selection buffer 115 (e.g., a tri-state buffer). A row selection signal 140-147 is applied to a row selection buffer 115 to select the output for a particular row.

To select a delay for the input signal 103 using the matrix delay 100, one of the eight columns of buffers 110 is selected by applying a control signal 120-127 to the control line 130-137 associated with the appropriate vertical column. In addition, one of the eight rows is selected by applying a row selection signal 140-147 to the row selection buffer 115 associated with the appropriate row. For example, the delay provided by matrix delay 100 can be incremented or decremented by a single delay element 105 at a time. However, with the conventional matrix delay 100, if a move to the next row is necessary to increment the delay by one (i.e., the buffer 110 associated with the last column—Column 7—of the present row is currently selected), the buffer 110 associated with the first (vertical) column (i.e., Column 0) of the next row must be selected. In addition, within a row, only moves between buffers 110 in contiguous columns can be made at any one time (e.g., from Column 1 to Column 2, not from Column 1 to Column 3), when the delay is changed by a single delay element 105 at a time. Thus, if Row n and Column 7 is currently selected, to move to Row n+1, the row selection signal for Row n is changed to "disabled," the row selection signal for Row n+1 is changed to "enabled," the control signal 127 for Column 7 is changed to "disabled," and the control signal 120 for Column 0 is changed to "enabled." Consequently, when moving from the last column of a row to the first column of the next row to increase the delay by a single delay element 105, at least four selectors must be changed for the delay matrix 100. Four selectors must also be changed when moving from the first column of a row to the last column of the previous row to decrease the delay by a single delay element 105.

However, to make the changes between rows in the matrix delay 100, all changes must be made simultaneously with a "zero" transition. If not made simultaneously, the output 107 can have an unknown state, since two (tri-state) buffers can be open and two (tri-state) buffers can be closed when the row is changed. In addition, if the changes are not made with a "zero" transition, a spike or other electrical disturbance can be created on the output 107.

SUMMARY OF THE INVENTION

A system and method are disclosed for delaying an input signal. In accordance with exemplary embodiments, according to a first aspect of the present invention, a diagonal matrix delay includes a plurality of rows of first buffers in serial communication with an input signal. The diagonal matrix delay includes a plurality of second buffers. Each second buffer is responsive to an output of an associated first buffer and to a column selection signal. The diagonal matrix delay includes a plurality of control lines. Each control line supplies column selection signals to the corresponding second buffers associated with each of the plurality of rows. Corresponding second buffers controlled by a control line are offset between contiguous rows by at least one column to form a substantially diagonal arrangement of columns of second buffers relative to the plurality of rows of first buffers.

According to the first aspect, outputs of second buffers associated with first buffers in each row are coupled together to form an output of each row. The diagonal matrix delay includes a plurality of third buffers. Each of the plurality of third buffers is responsive to a row selection signal and to the coupled output of second buffers in each row. Outputs of the plurality of third buffers are coupled together to provide an incrementally-delayed input signal from a selected row as an output signal of the diagonal matrix delay. According to an exemplary embodiment of the first aspect, each first buffer can comprise a delay element, and each second and third buffer can comprise a tri-state buffer. A change in selection between contiguous rows of first buffers requires an absence of change between corresponding columns of second buffers. The diagonal matrix delay can be formed on a monolithic substrate. A delay line loop or the like can comprise the diagonal matrix delay.

According to a second aspect of the present invention, a diagonal matrix delay includes a plurality of sets of delay buffers in serial communication with an input signal. The diagonal matrix delay includes a plurality of tap buffers. Each tap buffer is responsive to an output of an associated delay buffer and to a control signal for selecting an incremental delay of the input signal in a set. The diagonal matrix delay includes a plurality of selection lines. Each selection line supplies control signals to corresponding tap buffers associated with each of the plurality of sets. The corresponding tap buffers controlled by a selection line are offset between contiguous sets by at least one tap buffer to form an oblique arrangement of tap buffers relative to the plurality of sets of tap buffers.

According to the second aspect, outputs of tap buffers associated with delay buffers in a set are coupled together to form an output of the set. The diagonal matrix delay includes a plurality of set selection buffers. Each of the plurality of set selection buffers is responsive to a set selection signal and to the coupled output of tap buffers in each set. Outputs of the plurality of set selection buffers are coupled together to provide the incrementally-delayed input signal from a selected set as an output signal. According to an exemplary embodiment of the second aspect, each tap buffer can comprise a tri-state buffer, and each set selection buffer can comprise a tri-state buffer. A change between contiguous sets of delay buffers requires an absence of change between corresponding tap buffers. According to an exemplary embodiment of the second aspect, an integrated circuit can comprise the diagonal matrix delay.

According to a third aspect of the present invention, a diagonal matrix delay formed on a monolithic substrate for delaying an input signal includes a plurality of rows of delay buffers in serial communication with the input signal. A last delay buffer in a row is in communication with a first delay buffer of a next row. The diagonal matrix delay includes a plurality of tri-state buffers. Each tri-state buffer is responsive to an output of an associated delay buffer and to a column selection signal. Outputs of tri-state buffers associated with delay buffers in each row are coupled together to form an output of each row. The diagonal matrix delay includes a plurality of column selection lines. Each column selection line supplies column selection signals to the corresponding tri-state buffers associated with each of the plurality of rows of delay buffers. Tri-state buffers selected by a column selection line are offset between contiguous rows by at least one column. A change in selection between contiguous rows of delay buffers requires an absence of change between corresponding columns of tri-state buffers. The diagonal matrix delay includes a plurality of row-selection tri-state buffers. Each of the plurality of row-selection tri-state buffers is responsive to a row selection signal and to the coupled output of tri-state buffers in each row. Outputs of the plurality of row-selection tri-state buffers are coupled together to provide an incrementally-delayed input signal from a selected row as an output signal of the diagonal matrix delay. A delay line loop or the like can comprise the diagonal matrix delay.

According to a fourth aspect of the present invention, a diagonal matrix delay includes a plurality of rows of first buffer means in serial communication with an input signal. The diagonal matrix delay includes a plurality of second buffer means. Each second buffer means is responsive to an output of an associated first buffer means and to a column selection signal. The diagonal matrix delay includes a plurality of control means. Each control means supplies column selection signals to the corresponding second buffer means associated with each of the plurality of rows. Corresponding second buffer means controlled by a control means are offset between contiguous rows by at least one column to form a substantially diagonal arrangement of columns of second buffer means relative to the plurality of rows of first buffer means.

According to the fourth aspect, outputs of second buffer means associated with first buffer means in each row are coupled together to form an output of each row. The diagonal matrix delay includes a plurality of third buffer means. Each of the plurality of third buffer means is responsive to a row selection signal and to the coupled output of second buffer means in each row. Outputs of the plurality of third buffer means are coupled together to provide an incrementally-delayed input signal from a selected row as an output signal of the diagonal matrix delay. According to an exemplary embodiment of the fourth aspect, each first buffer means can comprise a delay buffer means. Additionally, each second buffer means and each third buffer means can comprise a tri-state buffer means. A change in selection between contiguous rows of first buffer means requires an absence of change between corresponding columns of second buffer means. The diagonal matrix delay can be formed on a monolithic substrate. A delay line loop means or the like can comprise the diagonal matrix delay.

According to a fifth aspect of the present invention, a diagonal matrix delay includes a plurality of sets of delay means in serial communication with an input signal. The diagonal matrix delay includes a plurality of tap means. Each tap means is responsive to an output of an associated delay means and to a control signal for selecting an incremental delay of the input signal in a set. The diagonal matrix delay includes a plurality of selection means. Each selection means supplies control signals to corresponding tap means associated with each of the plurality of sets. The corresponding tap means controlled by a selection means are offset between contiguous sets by at least one tap means to form an oblique arrangement of tap means relative to the plurality of sets of tap means.

According to the fifth aspect, outputs of tap means associated with delay means in a set are coupled together to form an output of the set. The diagonal matrix delay includes a plurality of set selection means. Each of the plurality of set selection means is responsive to a set selection signal and to the coupled output of tap means in each set. Outputs of the plurality of set selection means are coupled together to provide the incrementally-delayed input signal from a selected set as an output signal. According to an exemplary embodiment of the fifth aspect, each tap means can comprise a tri-state buffer means, and each set selection means can comprise a tri-state buffer means. A change between contiguous sets of delay means requires an absence of change between the corresponding tap means. According to an exemplary embodiment of the fifth aspect, an integrated circuit can comprise the diagonal matrix delay.

According to a sixth aspect of the present invention, a diagonal matrix delay formed on a monolithic substrate includes a plurality of rows of means for delaying an input signal. The plurality of rows of delaying means are in serial communication with the input signal. A last delaying means in a row is in communication with a first delaying means of a next row. The diagonal matrix delay includes a plurality of tri-state buffer means. Each tri-state buffer is responsive to an output of an associated delaying means and to a column selection signal. Outputs of tri-state buffer means associated with delaying means in each row are coupled together to form an output of each row. The diagonal matrix delay includes a plurality of column selection means. Each column selection means supplies column selection signals to the corresponding tri-state buffer means associated with each of the plurality of rows of delaying means. Tri-state buffer means selected by a column selection means are offset between contiguous rows by at least one column. A change in selection between contiguous rows of delaying means requires an absence of change between corresponding columns of tri-state buffer means. The diagonal matrix delay includes a plurality of row-selection tri-state buffer means. Each of the plurality of row-selection tri-state buffer means is responsive to a row selection signal and to the coupled output of tri-state buffer means in each row. Outputs of the plurality of row-selection tri-state buffer means are coupled together to provide an incrementally-delayed input signal from a selected row as an output signal of the diagonal matrix delay. A delay line loop means or the like can comprise the diagonal matrix delay.

According to a seventh aspect of the present invention, a method of delaying an input signal includes: a.) serially receiving the input signal at a plurality of rows of delay elements; b.) selecting a row of delay elements from among the plurality of rows of delay elements; c.) selecting an output of a delay element in the selected row by supplying a column selection signal to a tap buffer associated with the delay element and to corresponding tap buffers associated with each of the plurality of rows, wherein tap buffers selected by a column selection signal are offset between contiguous rows by at least one column to form an oblique arrangement of columns of tap buffers relative to the plurality of rows of delay elements; and d.) outputting an incrementally-delayed input signal from the selected delay element in the selected row.

According to the seventh aspect, (b) of the method can comprise: e.) applying a row selection signal to the row of delay elements to select the row. (d) of the method can comprise: f.) coupling outputs of tap buffers associated with delay elements in each row to form an output of each row; and g.) coupling outputs of each of the plurality of rows to provide the incrementally-delayed input signal from the selected row as an output signal. The method can include: h.) changing row selection from the selected row to a contiguous row of the plurality of rows in the absence of a change in the selection of the corresponding tap buffers.

According to an eighth aspect of the present invention, a method of selecting a delay of an input signal includes: a.) selecting a row of delay elements from among a plurality of rows of delay elements; b.) selecting an output of a delay element in the selected row by supplying a column selection signal to a tap buffer associated with the delay element and to corresponding tap buffers associated with each of the plurality of rows, wherein tap buffers selected by a column selection signal are offset between contiguous rows by at least one column to form an oblique arrangement of columns of tap buffers relative to the plurality of rows of delay elements; and c.) changing row selection from the selected row to a contiguous row of the plurality of rows in the absence of a change in the selection of the corresponding tap buffers.

According to the eighth aspect, the method can include: d.) applying a row selection signal to a row of delay elements to select the row. The method can include: e.) serially receiving the input signal at the plurality of rows of delay elements. The method can include f.) coupling outputs of tap buffers associated with delay elements in each row to form an output of each row; and g.) coupling outputs of each of the plurality of rows to provide an incrementally-delayed input signal from the selected row as an output signal.

According to a ninth aspect of the present invention, a method of delaying an input signal includes: a.) serially receiving the input signal at a plurality of rows of delay elements; b.) applying a row selection signal to a row of delay elements to select the row from among the plurality of rows of delay elements; c.) supplying a column selection signal to a tap buffer associated with a delay element in the selected row to select an output of the delay element, wherein the column selection signal is applied to corresponding tap buffers associated with each of the plurality of rows, and wherein tap buffers selected by a column selection signal are offset between contiguous rows by at least one column to form an oblique arrangement of columns of tap buffers relative to the plurality of rows of delay elements; d.) coupling outputs of tap buffers associated with delay elements in each row to form an output of each row; e.) coupling outputs of each of the plurality of rows to provide an incrementally-delayed input signal from the selected row; f.) outputting the incrementally-delayed input signal from the selected delay element in the selected row; and g.) changing row selection from the selected row to a second row of the plurality of rows in the absence of a change in the selection of the corresponding tap buffers.

According to a tenth aspect of the present invention, a diagonal matrix delay includes I rows of J buffers. For each of the I rows, an output of a jth one of the J buffers is in communication with an input of a (j+1)th one of the J buffers, and a (J−1)th buffer of row i is in communication with a 0th buffer of row (i+1), where $0 \leq j \leq (J-1)$ and $0 \leq i \leq (I-1)$. The diagonal matrix delay also includes K control lines, where K=J. For an ith one of the I rows, a kth one of the K control lines controls a jth one of the J buffers, where $0 \leq k \leq (K-1)$. For a (i+1)th one of the I rows, the kth one of the K control lines controls a (j+1) modulo J)th one of the J buffers. According to an exemplary embodiment of the tenth aspect, I=J. The diagonal matrix delay can be formed on a monolithic substrate.

According to an eleventh aspect of the present invention, a diagonal matrix delay includes I rows of J buffer means for delaying an input signal. For each of the I rows, an output of a jth one of the J buffer means is in communication with an input of a (j+1)th one of the J buffer means, and a (J−1)th buffer means of row i is in communication with a 0th buffer means of row (i+1), where $0 \leq j \leq (J-1)$ and $0 \leq i \leq (I-1)$. The diagonal matrix delay includes K control means for controlling the J buffer means of the I rows, where K=J. For an ith one of the I rows, a kth one of the K control means controls a jth one of the J buffer means, where $0 \leq k \leq (K-1)$. For a (i+1)th one of the I rows, the kth one of the K control means controls a ((j+1) modulo J)th one of the J buffer means. According to an exemplary embodiment of the eleventh aspect, I=J. The diagonal matrix delay can be formed on a monolithic substrate.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

Exemplary embodiments of the present invention are directed to a diagonal matrix delay system and method for delaying an input signal and providing an output signal.

According exemplary embodiments, a programmable matrix delay is comprised of rows of delay elements. Each delay element within a row can be selected by an associated tri-state buffer. The tri-state buffers are formed in columns across the rows. To move within a row to increase or decrease the delay of the input signal by, for example, a single delay element at a time, a column counter can be incremented or decremented by single units. However, to move between contiguous rows (e.g., to move from the delay element associated with the last column of a row to the delay element associated with the first column of the next row, or to move from the delay element associated with the first column of a row to the delay element associated with the last column of the previous row), only a row counter need be incremented or decremented. The matrix delay according to exemplary embodiments includes a diagonal decoder for the columns. In other words, tri-state buffers for a column are offset between contiguous rows by at least one position. Consequently, the tri-state buffers and the associated control lines for selecting a column are organized substantially diagonally across the delay matrix.

For purposes of illustration and not limitation, an eight row, eight column matrix delay is comprised of Rows 0, 1, ..., 7 and Columns 0, 1, ..., 7. If the delay element associated with Row 0, Column 7 is currently selected, then to move to the first delay element of the next row to increment the delay by a single delay element, only the row counter need be updated. According to exemplary embodiments, given the substantially diagonal structure of the columns, Column 7 of Row 1 occupies the first delay element of Row 1. In other words, the column selection signal on the control line that controls the delay element associated with Column 7 of Row 0 also controls the first delay element of Row 1 (i.e., Column 7 of Row 1), as the selection of both of these delay elements is controlled by the same control line. As the first element of the next row is selected when moving between the contiguous rows, the diagonal matrix delay provides the capability to move to the first delay element of Row 1 without changing the column counter, as Column 7 in Row 1 (i.e., the first element of Row 1) is already selected. Thus, exemplary embodiments of the present invention require only a single control change when moving between rows, thereby reducing the possibility of an unknown state or a spike or other undesirable electrical disturbance occurring on the output of the diagonal matrix delay.

Figure 2:
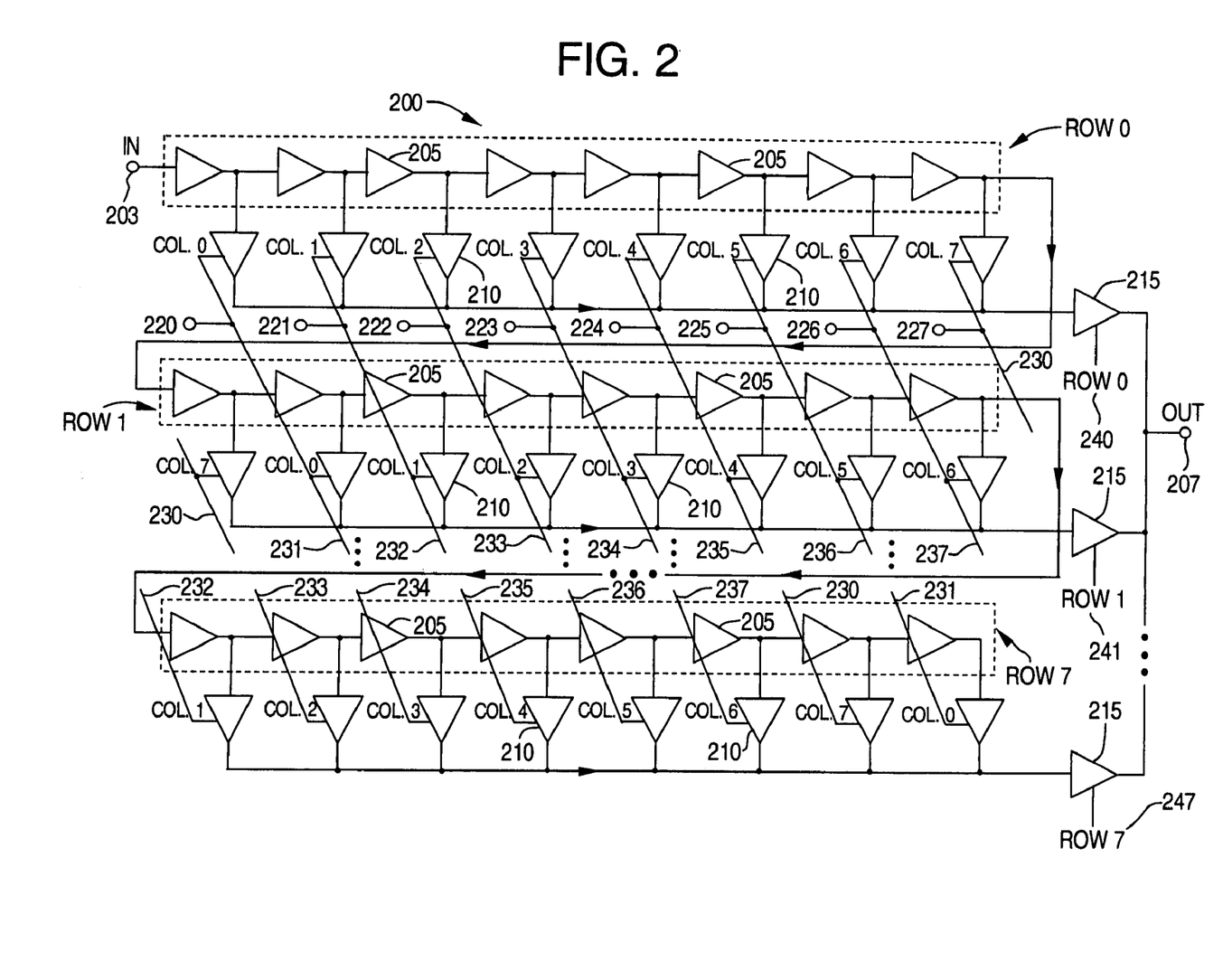
FIG. 2 is a circuit diagram illustrating a diagonal matrix delay for delaying an input signal and providing an output signal, in accordance with an exemplary embodiment of the present invention.

These and other aspects of the present invention will now be described in greater detail. FIG. 2 is a circuit diagram illustrating a diagonal matrix delay 200 for delaying an input signal 203 and providing an output signal 207, in accordance with an exemplary embodiment of the present invention. The diagonal matrix delay 200 includes a plurality of rows of first buffers 205 in serial communication with the input signal 203. The first buffers 205 within a row are serially coupled to provide incremental delays of the input signal 203. The last of the first buffers 205 in a row is coupled to the first of the first buffers 205 in the next row. For purposes of illustration and not limitation, the diagonal matrix delay 200 can be comprised of eight rows (i.e., Row 0, Row 1, ..., Row 7), although diagonal matrix delay 200 can be comprised of any appropriate number of rows.

The diagonal matrix delay 200 includes a plurality of second buffers 210. For purposes of illustration and not limitation, the plurality of second buffers 210 associated with each row can be arranged in eight columns (i.e., Column 0, Column 1, ..., Column 7), although the diagonal matrix delay 200 can be comprised of any appropriate number of columns, which can be the same or different than the number of rows. Each second buffer 210 is responsive to an output of an associated first buffer 205 and to a column selection signal, such as, for example, column selection signals 220-227. The diagonal matrix delay 200 also includes a plurality of control lines, such as, for example, control lines 230-237. Each control line 230-237 supplies a column selection signal 220-227 to corresponding second buffers 210 associated with each of the plurality of rows.

According to exemplary embodiments, the corresponding second buffers 210 controlled by a control line 230-237 are offset between contiguous rows by at least one column to form a substantially diagonal or otherwise oblique arrangement of columns of second buffers 210 relative to the plurality of rows of first buffers 205. As illustrated in FIG. 2, the columns of second buffers 210 are arranged substantially diagonally or otherwise obliquely relative to the plurality of rows of first buffers 205 in the diagonal matrix delay 200. For example, in FIG. 2, the second buffer 210 of Column 0 is the first element of Row 0. However, the second buffer 210 of Column 0 is the second element of Row 1, and so forth.

Figure 3:
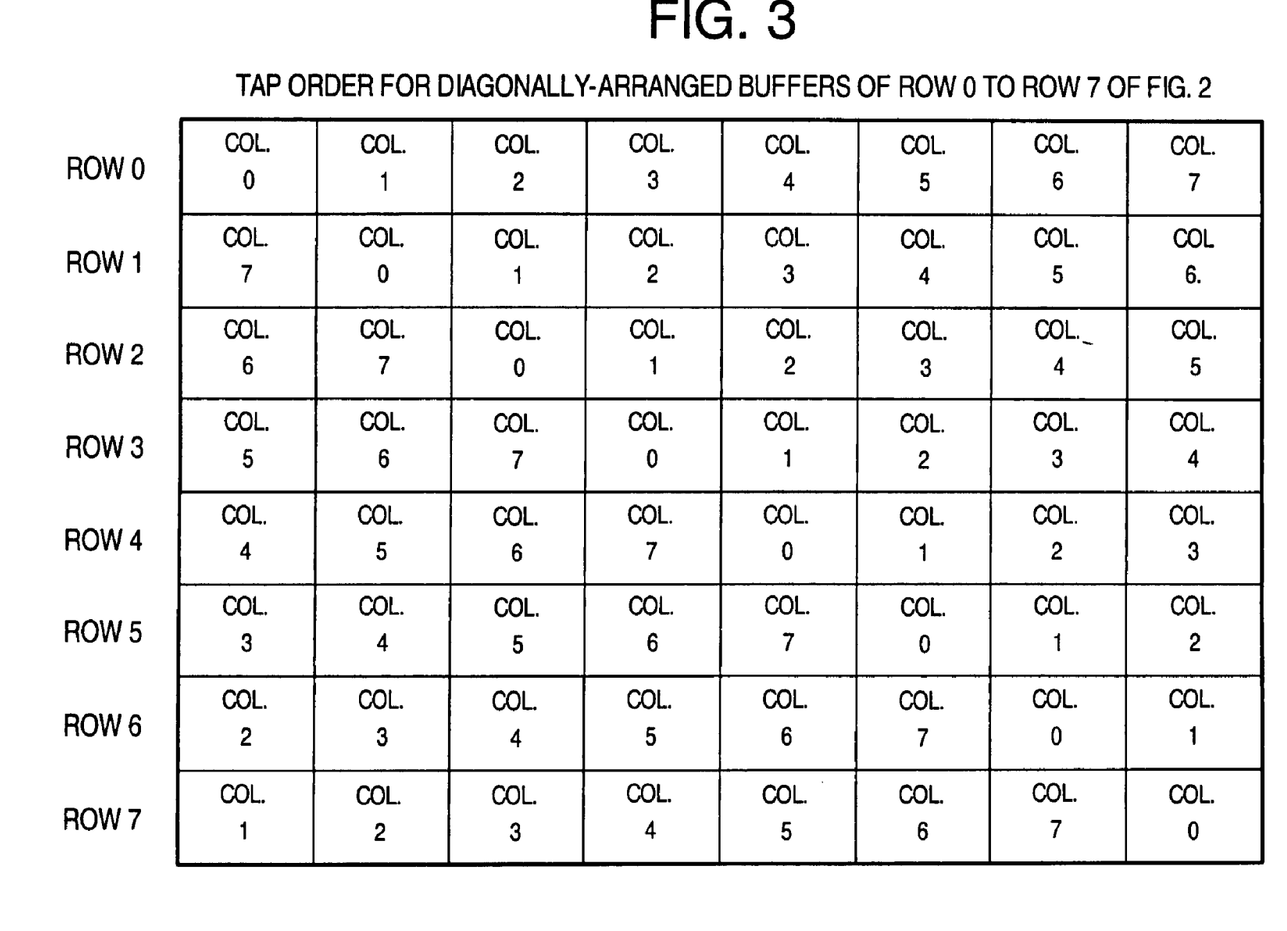
FIG. 3 is a table illustrating a tap order of diagonally-arranged buffers for a diagonal matrix delay, in accordance with an exemplary embodiment of the present invention.

FIG. 3 is a table illustrating the tap order of the substantially diagonally-arranged second buffers 210 for the diagonal matrix delay 200 of the present illustration, in accordance with an exemplary embodiment of the present invention. The number of the taps illustrated in the table of FIG. 3 will change depending on the number of rows and columns used in a diagonal delay matrix, although the substantially diagonal or otherwise oblique arrangement of those taps will remain.

As illustrated in FIG. 2, the control lines 230-237 are arranged substantially diagonally or otherwise obliquely relative to the plurality of rows of first buffers 205 to correspond to the substantially diagonal arrangement of the second buffers 210 to select a diagonal column of second buffers 210. For example, control line 231 is coupled to each of the buffers 210 substantially diagonally associated with Column 0 to supply control signal 220, control line 232 is coupled to each of the buffers 210 substantially diagonally associated with Column 1 to supply control signal 221, and so forth.

Additionally, the outputs of the second buffers 210 associated with first buffers 205 in each row are coupled together to form an output of each row. The diagonal matrix delay 200 includes a plurality of third buffers 215. Each of the plurality of third buffers 215 is responsive to a row selection signal 240-247 and to the coupled output of second buffers 210 in each row. The row selection signal 240-247 selects the appropriate row for output. The outputs of the plurality of third buffers 215 are coupled together to provide the incrementally-delayed input signal 203 from a selected row as the output signal 207 of the diagonal matrix delay 200.

For purposes of illustration and not limitation, suppose Row 0, Column 7 of diagonal matrix delay 200 is the currently-selected delay (i.e., the last delay element of Row 0). According to an exemplary embodiment, the delay of input signal 203 can be incremented or decremented by, for example, a single delay element at a time. Continuing with the illustration, it is desired to increment the delay of the input signal 203 by a single delay element, thereby requiring a move to the first buffer 205 comprising the first delay element in the next row (i.e., Row 1). According to exemplary embodiments, because the columns of second buffers 210 are arranged substantially diagonally or otherwise obliquely to the plurality of rows of first buffers 205, the first delay element of Row 1 is the second buffer 210 corresponding to Column 7 of Row 1. Given the arrangement of diagonal matrix delay 200, to move to Row 1, Column 7 to increment the delay of input signal 203 by a single delay element requires an increment in the row counter, not the column counter, since the second buffers 210 associated with Column 7 are already selected via control line 230. For example, the row selection signal 217 for Row 0 is changed to "disabled," and the row selection signal 217 for Row 1 is changed to "enabled." As the diagonal Column 7 of second buffers 210 has already been selected via control signal 227 along control line 230, no change in the column is necessary.

Thus, movement between contiguous rows can be performed by incrementing or decrementing a row counter without incrementing or decrementing a column counter to increase or decrease the delay of the input signal 203 by, for example, a single delay element at a time. In other words, a change in selection between contiguous rows of first buffers 205 to increment or decrement the delay by a single delay element at a time requires an absence of change between corresponding (diagonal) columns of second buffers 210 when moving, for example, from the last delay element of a row to the first delay element of the next row, or from the first delay element of a row to the last delay element of a previous row. However, the diagonal matrix delay 200 can be used to increase or decrease the delay of input signal 203 by any desired number of delay elements at a time.

According to an exemplary embodiment, each first buffer 205 can comprise any suitable type of delay element or the like. Additionally, each second buffer 210 and each third buffer 215 can comprise any suitable type of tri-state buffer or the like. The input signal 203 can be any suitable type of electrical or electronic signal that is capable of communicating electrical information. Additionally, column selection signal 220-227 and row selection signals 240-247 can be any suitable type of electrical or electronic signals that is capable of selecting a column or row, respectively. The components of diagonal matrix delay 200, or any combination thereof, can be formed on, for example, a monolithic substrate. Alternatively, each element, or any combination thereof, can be any suitable type of electrical or electronic component or device that is capable of performing the functions associated with the respective element. According to such an alternative exemplary embodiment, each component or device can be in communication with another component or device using any appropriate type of electrical connection that is capable of carrying electrical information.

Exemplary embodiments of the present invention can be used as at least part of an integrated circuit or any other suitable type of circuit that for delaying signals, such as, for example, a delay line loop, a delay line or the like. For example, the diagonal matrix delay 200 can be used in any device or system that communicates information, including both wired and wireless communication systems, read channel devices, disk drive systems (e.g., those employing read channel devices), other magnetic storage or recording applications, and the like, particularly integrated circuit applications where delay lines supporting higher frequencies are required.

Figure 4:
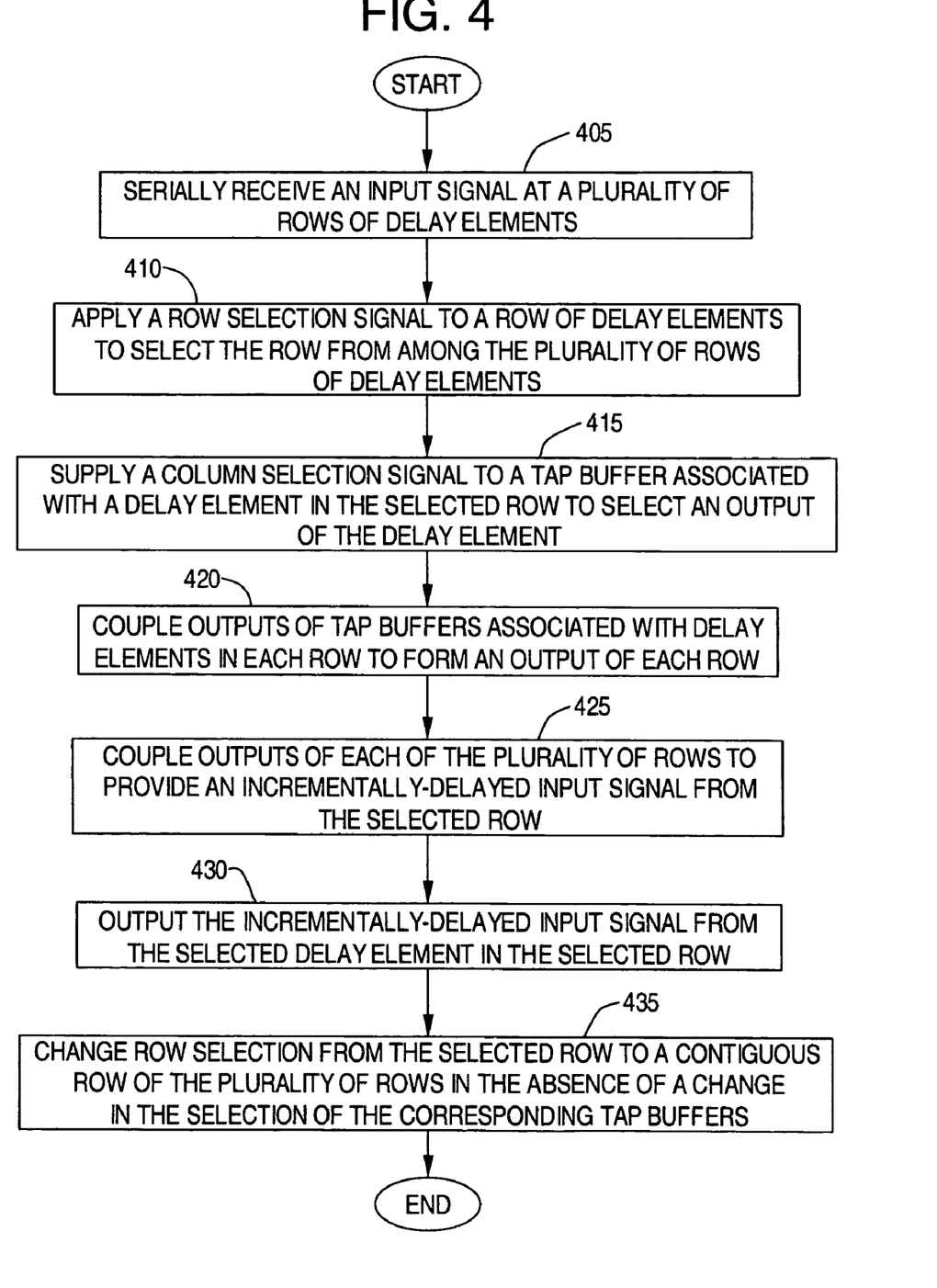
FIG. 4 is a flowchart illustrating delaying an input signal, in accordance with an exemplary embodiment of the present invention.

FIG. 4 is a flowchart illustrating delaying an input signal, in accordance with an exemplary embodiment of the present invention. In step 405, the input signal is serially received at a plurality of rows of delay elements. In step 410, a row selection signal is applied to a row of delay elements to select the row from among the plurality of rows of delay elements. In step 415, a column selection signal is supplied to a tap buffer associated with a delay element in the selected row to select an output of the delay element. The column selection signal is also applied to corresponding tap buffers associated with each of the plurality of rows. According to exemplary embodiments, tap buffers selected by a column selection signal are offset between contiguous rows by at least one column to form a substantially diagonal or otherwise oblique arrangement of columns of tap buffers relative to the plurality of rows of delay elements.

In step 420, outputs of tap buffers associated with delay elements in each row are coupled to form an output of each row. In step 425, outputs of each of the plurality of rows are coupled to provide an incrementally-delayed input signal from the selected row. In step 430, the incrementally-delayed input signal is output from the selected delay element in the selected row. In step 435, the row selection is changed from the selected row to a contiguous row of the plurality of rows in the absence of a change in the selection of the corresponding tap buffers.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

All United States patents and applications, foreign patents, and publications discussed above are hereby incorporated herein by reference in their entireties.

What is claimed is:

1. A method of delaying an input signal, comprising:
  a.) serially receiving the input signal at a plurality of rows of delay elements;
  b.) applying a row selection signal to a row of delay elements to select the row from among the plurality of rows of delay elements;
  c.) supplying a column selection signal to a tap buffer associated with a delay element in the selected row to select an output of the delay element,
    wherein the column selection signal is applied to corresponding tap buffers associated with each of the plurality of rows, and
    wherein tap buffers selected by a column selection signal are offset between contiguous rows by at least one column to form an oblique arrangement of columns of tap buffers relative to the plurality of rows of delay elements;
  d.) coupling outputs of tap buffers associated with delay elements in each row to form an output of each row;
  e.) coupling outputs of each of the plurality of rows to provide an incrementally-delayed input signal from the selected row;
  f.) outputting the incrementally-delayed input signal from the selected delay element in the selected row; and
  g.) changing row selection from the selected row to a contiguous row of the plurality of rows in the absence of a change in the selection of the corresponding tap buffers.

2. A method of delaying an input signal, comprising:
  a.) serially receiving the input signal at a plurality of rows of delay elements;
  b.) selecting a row of delay elements from among the plurality of rows of delay elements;
  c.) selecting an output of a delay element in the selected row by supplying a column selection signal to a tap buffer associated with the delay element and to corresponding tap buffers associated with each of the plurality of rows,
    wherein tap buffers selected by a column selection signal are offset between contiguous rows by at least one column to form an oblique arrangement of columns of tap buffers relative to the plurality of rows of delay elements; and d.) outputting an incrementally-delayed input signal from the selected delay element in the selected row.

3. The method of claim 2, wherein (b) comprises:

e.) applying a row selection signal to the row of delay elements to select the row.

4. The method of claim 2, wherein (d) comprises:

e.) coupling outputs of tap buffers associated with delay elements in each row to form an output of each row.

5. The method of claim 4, wherein (d) further comprises:

f.) coupling outputs of each of the plurality of rows to provide the incrementally-delayed input signal from the selected row as an output signal.

6. The method of claim 2, further comprising:

e.) changing row selection from the selected row to a contiguous row of the plurality of rows in the absence of a change in the selection of the corresponding tap buffers.

7. A method of selecting a delay of an input signal, comprising:

a.) selecting a row of delay elements from among a plurality of rows of delay elements;

b.) selecting an output of a delay element in the selected row by supplying a column selection signal to a tap buffer associated with the delay element and to corresponding tap buffers associated with each of the plurality of rows, wherein tap buffers selected by a column selection signal are offset between contiguous rows by at least one column to form an oblique arrangement of columns of tap buffers relative to the plurality of rows of delay elements; and c.) changing row selection from the selected row to a contiguous row of the plurality of rows in the absence of a change in the selection of the corresponding tap buffers.

8. The method of claim 7, further comprising:

d.) applying a row selection signal to a row of delay elements to select the row.

9. The method of claim 7, further comprising:

d.) serially receiving the input signal at the plurality of rows of delay elements.

10. The method of claim 9, further comprising:

e.) coupling outputs of tap buffers associated with delay elements in each row to form an output of each row; and f.) coupling outputs of each of the plurality of rows to provide an incrementally-delayed input signal from the selected row as an output signal.

* * * * *

UNITED STATES PATENT AND TRADEMARK OFFICE
CERTIFICATE OF CORRECTION

PATENT NO. : 7,405,983 B1  Page 1 of 1
APPLICATION NO. : 11/330982
DATED : July 29, 2008
INVENTOR(S) : Tomer Labin et al.

It is certified that error appears in the above-identified patent and that said Letters Patent is hereby corrected as shown below:

Column 7, Line 1        Insert -- to -- after "According"

Signed and Sealed this

Twenty-first Day of October, 2008

JON W. DUDAS
*Director of the United States Patent and Trademark Office*